US012694899B2

(12) United States Patent
Setoma

(10) Patent No.: US 12,694,899 B2
(45) Date of Patent: Jul. 28, 2026

(54) DISK DEVICE HAVING FLEXURE WITH PROTRUSION

(71) Applicants: Kabushiki Kaisha Toshiba, Tokyo (JP); Toshiba Electronic Devices & Storage Corporation, Tokyo (JP)

(72) Inventor: Shunya Setoma, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 0 days.

(21) Appl. No.: 18/985,671

(22) Filed: Dec. 18, 2024

(65) Prior Publication Data

US 2025/0124949 A1     Apr. 17, 2025

Related U.S. Application Data

(62) Division of application No. 17/942,954, filed on Sep. 12, 2022, now Pat. No. 12,211,528.

(30) Foreign Application Priority Data

Mar. 16, 2022     (JP) ................................. 2022-041651

(51) Int. Cl.
　　*G11B 5/48*　　　　(2006.01)
　　*H10N 30/87*　　　(2023.01)
(52) U.S. Cl.
　　CPC .......... *G11B 5/4873* (2013.01); *G11B 5/4826* (2013.01); *G11B 5/4833* (2013.01);
　　(Continued)
(58) Field of Classification Search
　　None
　　See application file for complete search history.

(56) References Cited

U.S. PATENT DOCUMENTS 8,593,765 B2　　11/2013　Uematsu et al.
8,934,203 B2　　1/2015　Hanya et al.
　　　　　　　　(Continued)

FOREIGN PATENT DOCUMENTS

CN　　104240725 A　　12/2014
CN　　111653295 A　　9/2020
　　　　　(Continued)

OTHER PUBLICATIONS

Non-Final Office Action mailed Jul. 2, 2024 in U.S. Appl. No. 18/392,972, 23 pages.
　　　　　(Continued)

*Primary Examiner* — William J Klimowicz
(74) *Attorney, Agent, or Firm* — Kim & Stewart LLP

(57) ABSTRACT

According to one embodiment, a disk device includes a magnetic disk, a magnetic head, a flexure, a piezoelectric element, a first bonding material, a second bonding material, and a protrusion. The flexure includes a first outer surface, a first pad, and a second pad. The first pad and the second pad are on the first outer surface. The piezoelectric element includes a second outer surface, a first electrode, and a second outer surface. The first electrode and the second electrode are on the second outer surface. The first bonding material, which is conductive, bonds the first pad and the first electrode. The second bonding material, which is conductive, bonds the second pad and the second electrode. The protrusion is provided on the flexure, is located at least partially between the first bonding material and the second bonding material, and protrudes from the first outer surface.

8 Claims, 12 Drawing Sheets

(52) U.S. Cl.
CPC ........... *G11B 5/4853* (2013.01); *H10N 30/87* (2023.02); *G11B 2220/2516* (2013.01)

(56) References Cited

U.S. PATENT DOCUMENTS

| | | | |
|---|---|---|---|
| 9,111,559 B1 | 8/2015 | Hahn et al. | |
| 9,117,466 B2 | 8/2015 | Takikawa et al. | |
| 9,224,410 B1 | 12/2015 | Ee et al. | |
| 9,251,817 B1 | 2/2016 | Hahn et al. | |
| 9,368,138 B2 | 6/2016 | Inoue et al. | |
| 10,566,016 B2 | 2/2020 | Yamada et al. | |
| 10,957,351 B2 | 3/2021 | Nesori | |
| 10,984,825 B2 | 4/2021 | Suzuki | |
| 11,120,823 B1 | 9/2021 | Nesori et al. | |
| 11,195,549 B1 | 12/2021 | Nojima | |
| 11,348,609 B2 | 5/2022 | Nesori | |
| 12,211,528 B2 * | 1/2025 | Setoma | H10N 30/206 |
| 12,243,567 B2 * | 3/2025 | Setoma | H10N 30/206 |
| 2001/0013993 A1 | 8/2001 | Coon | |
| 2011/0149440 A1 | 6/2011 | Uematsu et al. | |
| 2014/0022670 A1 | 1/2014 | Takikawa et al. | |
| 2014/0022671 A1 | 1/2014 | Takikawa et al. | |
| 2014/0022675 A1 | 1/2014 | Hanya et al. | |
| 2014/0085755 A1 * | 3/2014 | Hanya | G11B 5/483 360/244.5 |
| 2014/0368954 A1 | 12/2014 | Inoue et al. | |
| 2014/0377973 A1 | 12/2014 | Ikeji et al. | |
| 2016/0133284 A1 | 5/2016 | Terada et al. | |
| 2019/0066720 A1 * | 2/2019 | Yamada | G11B 5/4833 |
| 2019/0267032 A1 * | 8/2019 | Naniwa | G11B 5/4873 |
| 2020/0265866 A1 | 8/2020 | Suzuki | |
| 2020/0286511 A1 | 9/2020 | Nesori | |
| 2020/0381013 A1 | 12/2020 | Suzuki | |
| 2021/0210117 A1 | 7/2021 | Suzuki | |
| 2022/0076698 A1 * | 3/2022 | Nesori | G11B 5/4873 |
| 2023/0298622 A1 | 9/2023 | Setoma | |
| 2024/0127852 A1 * | 4/2024 | Setoma | H10N 30/875 |
| 2025/0124948 A1 * | 4/2025 | Setoma | G11B 5/4873 |

FOREIGN PATENT DOCUMENTS

| | | | |
|---|---|---|---|
| JP | 2013251031 A | 12/2013 | |
| JP | 2014191853 A | 10/2014 | |
| JP | 5869200 B2 * | 2/2016 | .......... G11B 5/4826 |
| JP | 2016-219094 A | 12/2016 | |
| JP | 2020-135906 A | 8/2020 | |

OTHER PUBLICATIONS

First Office Action mailed Dec. 20, 2025 in corresponding Chinese Patent Application No. 202210586725.8, with English machine translation, 15 pages.
U.S. Non-Final Office Action dated Mar. 25, 2026, mailed in co-pending U.S. Appl. No. 18/985,652, 19 pages.

* cited by examiner

DISK DEVICE HAVING FLEXURE WITH PROTRUSION

CROSS-REFERENCE TO RELATED APPLICATIONS

This application is a division of U.S. patent application Ser. No. 17/942,954, filed on Sep. 12, 2022, which is based upon and claims the benefit of priority from Japanese Patent Application No. 2022-041651, filed on Mar. 16, 2022, the entire contents of each of which are incorporated herein by reference.

FIELD

Embodiments described herein relate generally to a disk device.

BACKGROUND

A disk device such as a hard disk drive includes magnetic disks, magnetic heads that read and write information from and to the magnetic disks, flexible flexures on which the magnetic head are mounted, and piezoelectric elements that adjust the magnetic heads in position by deforming the flexures. The piezoelectric elements are attached to the flexures using a bonding material such as a conductive adhesive.

The bonding material works to bond the electrodes of the piezoelectric elements and flexure pads together. In attaching a piezoelectric element to a flexure, the bonding material may be pressed between the piezoelectric element and the flexure and spread toward an unintended, non-corresponding electrode.

BRIEF DESCRIPTION OF THE DRAWINGS

FIG. 4 is an exemplary cross-sectional view illustrating a part of the suspension of the first embodiment along line F4-F4 of FIG. 3;

FIG. 7 is an exemplary cross-sectional view illustrating a part of a suspension according to a modification of the first embodiment;

FIG. 8 is an exemplary cross-sectional view illustrating a part of a suspension according to a second embodiment;

FIG. 9 is an exemplary cross-sectional view illustrating a part of a suspension according to a third embodiment;

DETAILED DESCRIPTION

In general, according to one embodiment, a disk device includes a magnetic disk, a magnetic head, a flexure, a piezoelectric element, a first bonding material, a second bonding material, and a protrusion. The magnetic head is configured to read and write information from and to the magnetic disk. The magnetic head is mounted on the flexure. The flexure includes a first outer surface, a first pad, and a second pad. The first pad is on the first outer surface. The second pad is on the first outer surface apart from the first pad in a first direction along the first outer surface. The piezoelectric element includes a second outer surface, a first electrode, and a second outer surface. The second outer surface faces the first outer surface. The first electrode is on the second outer surface. The second electrode is on the second outer surface apart from the first electrode in the first direction. The first bonding material, which is conductive, bonds the first pad and the first electrode. The second bonding material, which is conductive, bonds the second pad and the second electrode. The protrusion is provided on the flexure, is located at least partially between the first bonding material and the second bonding material, and protrudes from the first outer surface.

First Embodiment

Hereinafter, a first embodiment will be described with reference to FIGS. 1 to 7. Note that, in the present specification, the components according to embodiments and descriptions of the components may be described in a plurality of expressions. The components and the description are examples, and are not limited by the expression of the present specification. The components may also be identified with names different from those in the present specification. In addition, the component may be described by an expression different from the expression in the present specification.

Figure 1:
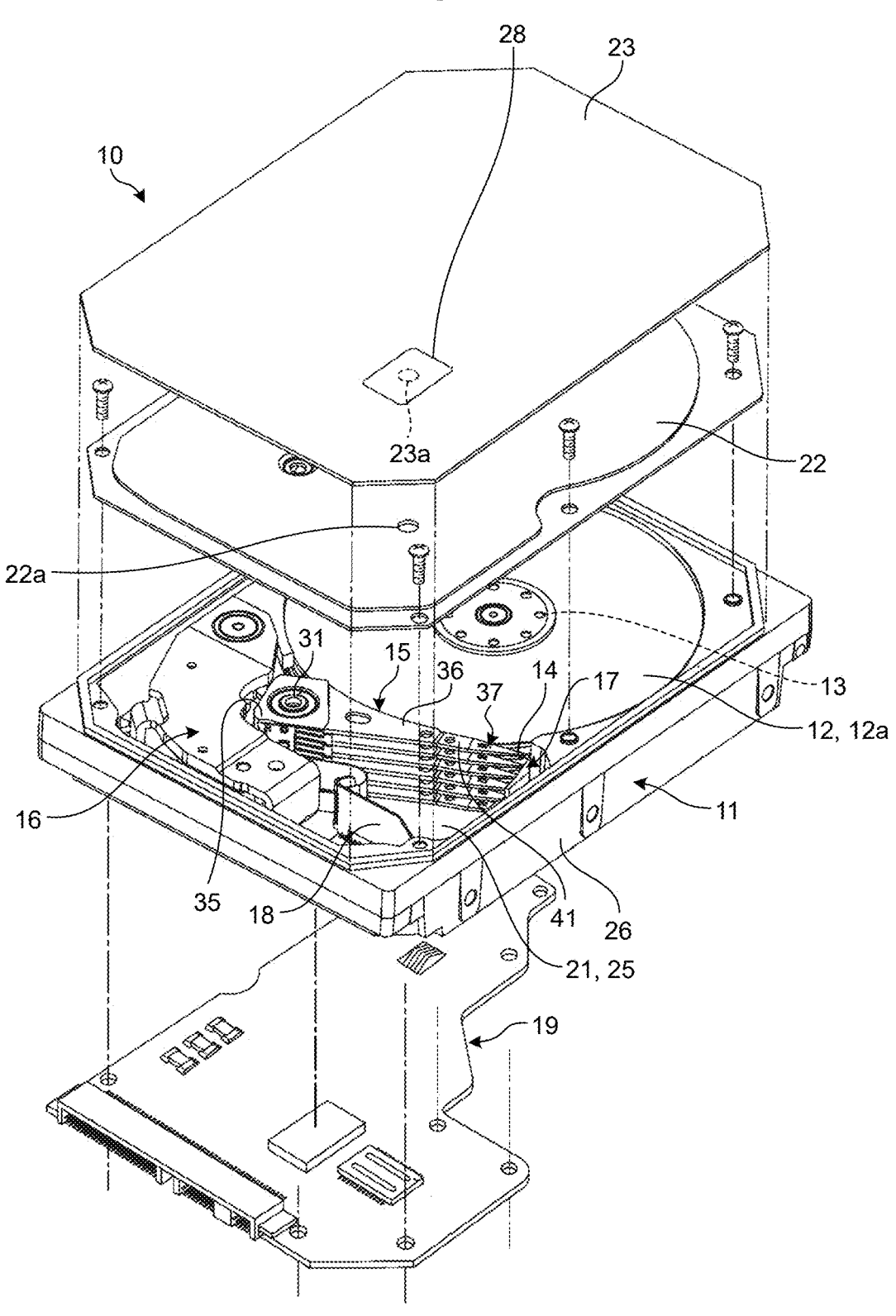
FIG. 1 is an exemplary perspective view illustrating an exploded hard disk drive according to a first embodiment.

FIG. 1 is an exemplary perspective view illustrating an exploded hard disk drive (HDD) 10 according to a first embodiment. The HDD 10 is an example of a disk device, and may also be referred to as an electronic device, a storage device, an external storage device, or a magnetic disk device.

The HDD 10 includes a housing 11, a plurality of magnetic disks 12, a spindle motor 13, a plurality of magnetic heads 14, an actuator assembly 15, a voice coil motor (VCM) 16, a ramp load mechanism 17, a flexible printed wiring board (FPC) 18, and a printed wiring board (PCB) 19. The magnetic head 14 may also be referred to as a slider.

The housing 11 includes a base 21, an inner cover 22, and an outer cover 23. The base 21 is a bottomed container and has a bottom wall 25 and a side wall 26. The bottom wall 25 has a substantially rectangular (quadrangular) plate shape. The side wall 26 protrudes from an edge of the bottom wall 25.

The inner cover 22 is attached to the end of the side wall 26 with, for example, screws. The outer cover 23 covers the inner cover 22 and is airtightly fixed to the end of the side wall 26 by welding, for example.

The inside of the housing 11 is sealed. The magnetic disks 12, the spindle motor 13, the magnetic heads 14, the actuator assembly 15, the VCM 16, the ramp load mechanism 17, and the FPC 18 are disposed inside the housing 11.

The inner cover 22 is provided with a vent 22a. The outer cover 23 is provided with a vent 23a. After the components are attached to the inside of the base 21 and the inner cover 22 and the outer cover 23 are attached to the base 21, the air inside the housing 11 is removed from the vents 22a and 23a. Furthermore, the housing 11 is filled with a gas different from air.

The gas filling the housing 11 is, for example, a low density gas having a density lower than that of air, an inert gas having low reactivity, and the like. For example, the housing 11 is filled with helium inside. Note that the inside of the housing 11 may be filled with another fluid. In addition, the inside of the housing 11 may be maintained at vacuum, low pressure close to vacuum, or negative pressure lower than atmospheric pressure.

The vent 23a of the outer cover 23 is closed by a seal 28. The seal 28 airtightly seals the vent 23a and prevents the fluid filling the housing 11 from leaking from the vent 23a.

The magnetic disk 12 is, for example, a disk-shaped recording medium having a magnetic recording layer provided on a recording surface 12a such as an upper surface and a lower surface. The diameter of the magnetic disk 12 in the example of FIG. 1 is, for example, 3.5 inches, but is not limited to this example.

The spindle motor 13 supports and rotates the plurality of magnetic disks 12 stacked at intervals in the direction in which the recording surface 12a faces. The plurality of magnetic disks 12 is held by the hub of the spindle motor 13 by, for example, a clamp spring.

The magnetic head 14 records and reproduces information on and from the recording layer of the magnetic disk 12. In other words, the magnetic head 14 reads and writes information from and to the magnetic disk 12. The magnetic head 14 is mounted on the actuator assembly 15.

The actuator assembly 15 is rotatably supported by a support shaft 31 disposed apart from the magnetic disk 12. The VCM 16 rotates and disposes the actuator assembly 15 at a desired position. The ramp load mechanism 17 holds the magnetic head 14 moved to the outermost periphery of the magnetic disk 12 at an unload position spaced apart from the magnetic disk 12.

The actuator assembly 15 includes an actuator block 35, a plurality of arms 36, and a plurality of head suspension assemblies (suspensions) 37. The suspension 37 may also be referred to as a head gimbal assembly (HGA).

The actuator block 35 is rotatably supported by the support shaft 31 via a bearing, for example. The plurality of arms 36 protrude from the actuator block 35 in a direction substantially orthogonal to the support shaft 31. The actuator block 35 and the plurality of arms 36 are integrally formed.

The plurality of arms 36 is disposed at intervals in the direction in which the support shaft 31 extends. Each of the arms 36 has a plate shape to enter between the adjacent magnetic disks 12. The arms 36 extend substantially in parallel.

A voice coil of the VCM 16 is provided on a protrusion protruding from the actuator block 35 to the opposite side of the arm 36. The VCM 16 includes a pair of yokes, a voice coil disposed between the yokes, and a magnet provided on the yoke.

As described above, the VCM 16 rotates the actuator assembly 15. In other words, the VCM 16 integrally rotates (moves) the actuator block 35, the arm 36, and the suspension 37.

The suspension 37 is attached to a distal end of the corresponding arm 36 and protrudes from the arm 36. As a result, the plurality of suspensions 37 is disposed at intervals in the direction in which the support shaft 31 extends.

Figure 2:
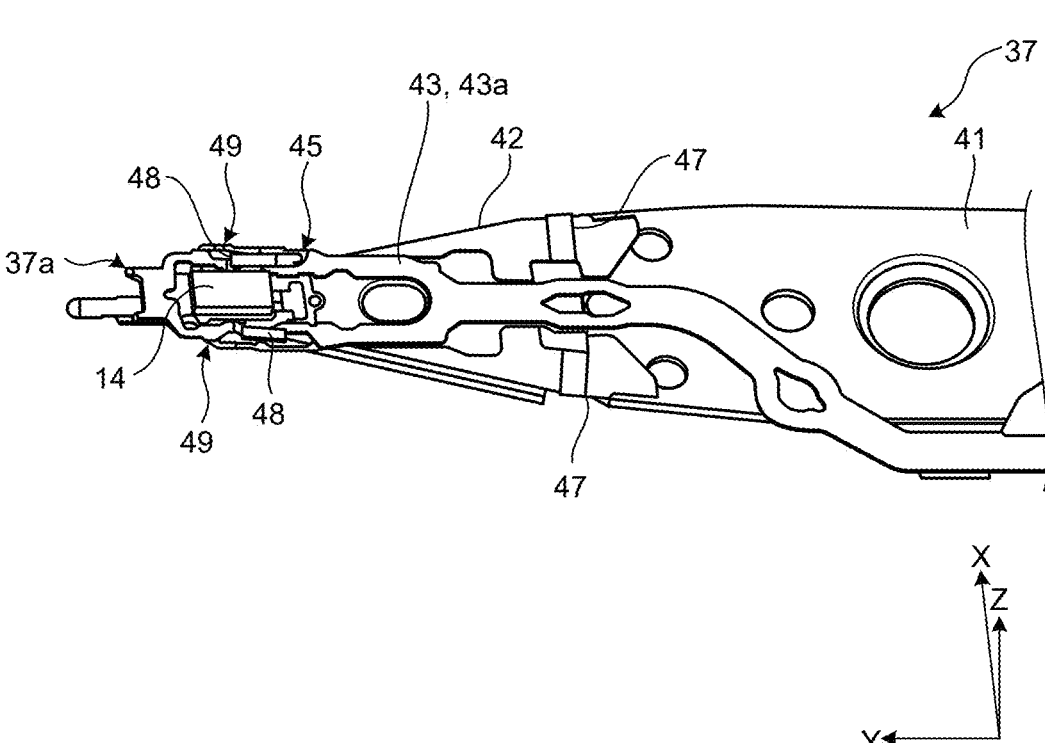
FIG. 2 is an exemplary perspective view illustrating a part of a suspension of the first embodiment.

FIG. 2 is an exemplary perspective view illustrating a part of the suspension 37 of the first embodiment. As illustrated in the drawings, in the present specification, an X axis, a Y axis, and a Z axis are defined for convenience. The X axis, the Y axis, and the Z axis are orthogonal to each other. The X axis is provided along the width of the suspension 37. The Y axis is provided along the length of the suspension 37. The Z axis is provided along the thickness of the suspension 37.

Furthermore, in the present specification, an X direction, a Y direction, and a Z direction are defined. The X direction is a direction along the X axis and includes a +X direction indicated by the arrow of the X axis and a −X direction that is an opposite direction of the arrow of the X axis. The Y direction is a direction along the Y axis and includes a +Y direction indicated by the arrow of the Y axis and a −Y direction that is an opposite direction of the arrow of the Y axis. The Z direction is a direction along the Z axis and includes a +Z direction indicated by the arrow of the Z axis and a −Z direction that is an opposite direction of the arrow of the Z axis.

The suspension 37 extends from the arm 36 in the +Y direction. Note that the arm 36 also extends from the actuator block 35 in the +Y direction. The Y direction is a longitudinal direction of the arm 36 and the suspension 37.

Each of the plurality of suspensions 37 includes a base plate 41, a load beam 42, and a flexure 43. Further, the magnetic head 14 is disposed at a distal end 37a of the suspension 37. The distal end 37a is the end of the suspension 37 in the +Y direction. Note that the end of suspension 37 in the −Y direction is attached to the arm 36. In addition, in the present specification, the end refers to not only an end of the element but also a portion near the end.

The base plate 41 and the load beam 42 are made of, for example, stainless steel. Note that the materials of the base plate 41 and the load beam 42 are not limited to this example. The base plate 41 has a plate shape and is attached to the distal end of the arm 36. The load beam 42 has a plate shape thinner than the base plate 41. The load beam 42 is attached to the distal end of the base plate 41 and protrudes from the base plate 41.

The flexure 43 has an elongated belt shape. Note that the shape of the flexure 43 is not limited to this example. The flexure 43 is a flexible multi-layer plate including an insulating layer and a conductive layer on which wiring is arranged.

The flexure 43 includes a gimbal (elastic support portion) 45 at an end in the +Y direction. The gimbal is displaceable and located above the load beam 42. The gimbal 45 is provided at the distal end 37a of the suspension 37. The magnetic head 14 is mounted on the gimbal 45 of the flexure 43.

The end of the flexure 43 in the −Y direction is connected to the FPC 18 on the actuator block 35, for example. As a result, the FPC 18 is electrically connected to the magnetic head 14 via the wiring of the flexure 43.

A pair of first microactuators (MAs) 47 and a pair of second microactuators (MAs) 48 are mounted on the suspension 37. The first MAs 47 and the second MAs 48 are piezoelectric elements. The first MAs 47 and the second MAs 48 are, for example, bulk piezoelectric elements. Note that the first MAs 47 and the second MAs 48 may be bulk and multilayer or thin-film piezoelectric elements. The first MAs 47 and the second MAs 48 are not limited to this example.

Each of the pair of first MAs 47 connects, for example, the base plate 41 and the load beam 42. The end of the first MAs 47 in the +Y direction is attached to the load beam 42, and the end of the first MAs 47 in the −Y direction is attached to the base plate 41. Note that the first MAs 47 are not limited to this example. The pair of first MAs 47 is disposed apart from each other in the X direction.

The first MAs 47 can expand and contract in the Y direction according to the applied voltage. As the pair of first MAs 47 individually expand and contract, a portion of the suspension 37 closer to the distal end 37*a* than the first MAs 47 elastically bends in the width direction. As a result, the first MAs 47 moves the magnetic head 14 mounted on the distal end 37*a* of the suspension 37.

The pair of second MAs 48 is disposed near the distal end 37*a* of the suspension 37. For example, the second MAs 48 are mounted on the gimbal 45. The pair of second MAs 48 is disposed apart from each other in the X direction.

The second MAs 48 can expand and contract in the Y direction according to the applied voltage. As the pair of second MAs 48 individually expand and contract, the distal end 37*a* of the suspension 37 elastically bends in the X direction. As a result, the second MAs 48 moves the magnetic head 14 mounted on the distal end 37*a* of the suspension 37.

As described above, the HDD 10 of the present embodiment adjusts the position of the magnetic head 14 by a so-called triple stage actuator (TSA) method in which the magnetic head 14 is moved by the VCM 16, the first MAs 47, and the second MAs 48.

The PCB 19 illustrated in FIG. 1 is, for example, a rigid board such as a glass epoxy board, a multilayer board, a build-up board, or the like. The PCB 19 is disposed outside the housing 11 and is attached to the outside of the bottom wall 25 of the base 21.

Various electronic components such as a relay connector connected to the FPC 18, an interface (I/F) connector connected to the host computer, and a controller that controls the operation of the HDD 10 are mounted on the PCB 19. The relay connector is electrically connected to the FPC 18 via a connector provided on the bottom wall 25.

The flexure 43 has an outer surface 43*a*. The outer surface 43*a* is an example of the first outer surface. The outer surface 43*a* is approximately flat and faces substantially the +Z direction. Note that the outer surface 43*a* may be provided with minute unevenness. When the magnetic head 14 is located on the magnetic disk 12, the outer surface 43*a* faces the recording surface 12*a* of the magnetic disk 12.

The magnetic head 14 is mounted on the outer surface 43*a*. For example, a plurality of pads is provided on the outer surface 43*a*. The electrodes of the magnetic heads 14 are connected to pads on the outer surface 43*a* by, for example, solder. Furthermore, the magnetic head 14 is fixed to the outer surface 43*a* by, for example, an adhesive.

The gimbal 45 of the flexure 43 has two MA mounts 49. Each of the two second MAs 48 is attached to the outer surface 43*a* of the flexure 43 on the corresponding one of the two MA mounts 49.

Figure 3:
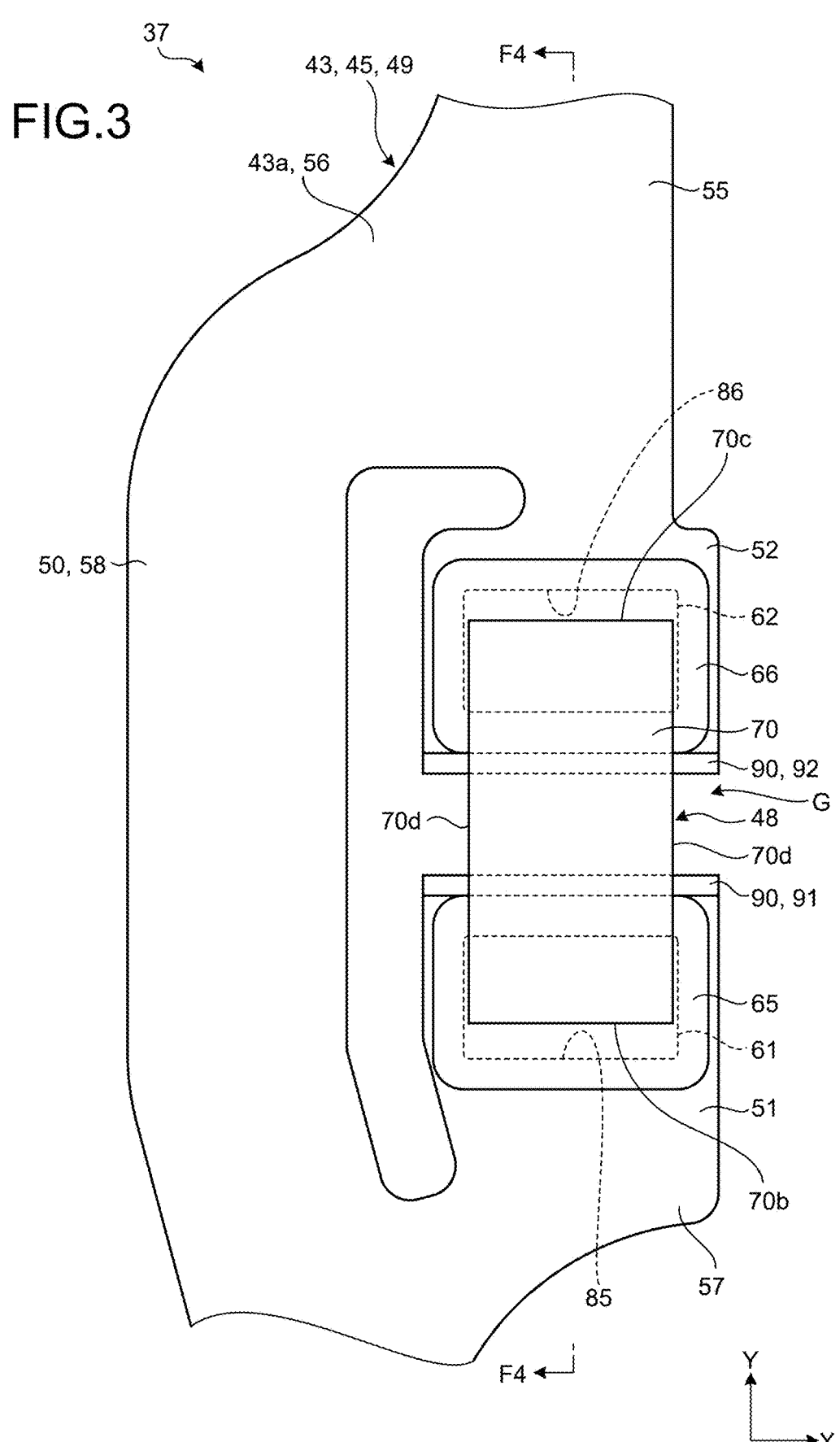
FIG. 3 is an exemplary plan view illustrating a part of the suspension of the first embodiment.

FIG. 3 is an exemplary plan view illustrating a part of the suspension 37 of the first embodiment. As illustrated in FIG. 3, each of the two MA mounts 49 includes a periphery 50, a first connection 51, and a second connection 52. The periphery 50 includes a first band portion 55, a second band portion 56, a third band portion 57, and a fourth band portion 58.

The first band portion 55 is spaced apart from the corresponding second MA 48 in the +Y direction and extends substantially in the Y direction. The second band portion 56 extends from the end of the first band portion 55 in the −Y direction toward the outside of the flexure 43 in the X direction.

The third band portion 57 is spaced apart from the corresponding second MA 48 in the −Y direction. The fourth band portion 58 is apart from the corresponding second MA 48 in the substantially X direction and extends in the substantially Y direction along the second MA 48. The fourth band portion 58 is connected to an end of the second band portion 56 in the X direction and an end of the third band portion 57 in the X direction. In other words, the fourth band portion 58 connects the second band portion 56 and the third band portion 57.

The first band portion 55, the second band portion 56, the third band portion 57, and the fourth band portion 58 are spaced apart from the corresponding second MA 48 and surround the second MA 48 from three sides. As such, the periphery 50 has a substantially C shape. In the direction orthogonal to the Z direction, the second MA 48 is located apart from the periphery 50 and surrounded by the periphery 50.

The first connection 51 protrudes from the third band portion 57 in the +Y direction. The first connection 51 is spaced apart from the first band portion 55, the second band portion 56, and the fourth band portion 58. A first pad 61 is placed in the first connection 51 on the outer surface 43*a*.

The second connection 52 protrudes from the first band portion 55 in the −Y direction. The second connection 52 is spaced apart from the third band portion 57 and the fourth band portion 58. In addition, the second connection 52 is spaced apart from the first connection 51 in the +Y direction. The +Y direction is a direction along the outer surface 43*a*, and is an example of the first direction.

A second pad 62 is placed in the second connection 52 on the outer surface 43*a*. That is, the second pad 62 is spaced apart from the first pad 61 in the +Y direction on the outer surface 43*a*.

One end of the corresponding second MA 48 is joined to the first pad 61 with a first adhesive 65. The first adhesive is an example of the first bonding material. The other end of the corresponding second MA 48 is joined to the second pad 62 with a second adhesive 66. The second adhesive 66 is an example of the second bonding material.

In the present embodiment, the first adhesive 65 and the second adhesive 66 are conductive adhesives. For example, the first adhesive 65 and the second adhesive 66 are epoxy-based adhesives mixed with a conductive filler such as silver. Note that the first bonding material and the second bonding material may be other conductive bonding materials such as solder.

The first connection 51 and the second connection 52 protrude from the substantially C-shaped periphery 50 toward the inside of the periphery 50. The flexure 43 is provided with a gap G separating the first connection 51 and the second connection 52.

The gap G is a hole or a cutout penetrating the flexure 43 in the substantially Z direction. The gap G is in alignment with part of the corresponding second MA 48 in the substantially Z direction between the first connection 51 and the second connection 52. The Z direction is an example of a direction orthogonal to the first outer surface.

Along with an expansion or contraction of the second MA 48 in the Y direction, the distance between the first connection 51 and the second connection 52 changes. For example, the distal end 37*a* of the suspension 37 is elastically bent along with a decrease in the distance between the first connection 51 and the second connection 52 in one of the MA mounts 49, and an increase in the distance between the first connection 51 and the second connection 52 in the other MA mount 49.

Figure 4:
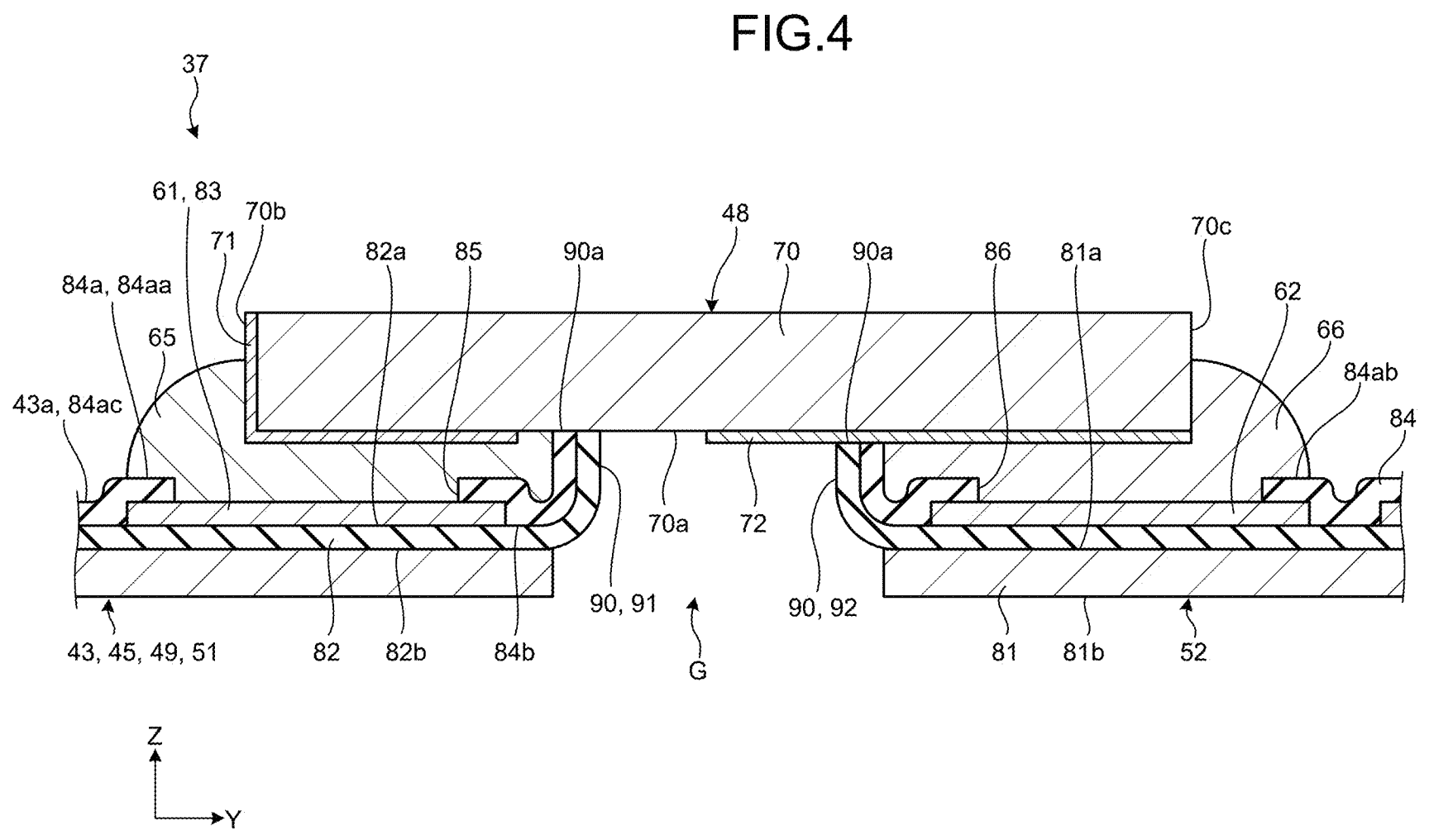

FIG. 4 is an exemplary cross-sectional view illustrating a part of the suspension 37 of the first embodiment along line F4-F4 of FIG. 3. As illustrated in FIG. 4, the second MA 48 includes a piezoelectric body 70, a first electrode 71, and a second electrode 72.

The piezoelectric body 70 has a substantially rectangular parallelepiped shape extending in the Y direction. The piezoelectric body 70 has a bottom surface 70a, a first end surface 70b, and a second end surface 70c. The bottom surface 70a is an example of the second outer surface.

The bottom surface 70a is located at the end of the piezoelectric body 70 in the −Z direction. The bottom surface 70a is substantially flat and faces the −Z direction. The bottom surface 70a faces the outer surface 43a of the flexure 43 through a gap.

The bottom surface 70a faces the outer surface 43a of the first connection 51 and faces the outer surface 43a of the second connection 52. The bottom surface 70a and the outer surface 43a are disposed substantially parallel to each other. Note that the bottom surface 70a may be inclined with respect to the outer surface 43a.

The first end surface 70b is provided at the end of the piezoelectric body 70 in the −Y direction. The second end surface 70c is opposite the first end surface 70b, and is provided at the end of the piezoelectric body 70 in the +Y direction.

As illustrated in FIG. 3, the piezoelectric body 70 further includes two side surfaces 70d. The side surfaces 70d are an example of both ends of the piezoelectric element. The two side surfaces 70d are provided at both ends of the piezoelectric body 70 in the X direction.

The first electrode 71 in FIG. 4 is, for example, a positive electrode of the second MA 48. The first electrode 71 is placed on the bottom surface 70a and the first end surface 70b. The first electrode 71 is spaced apart from the second end surface 70c.

The second electrode 72 is, for example, a negative electrode of the second MA 48. The second electrode 72 is placed on the bottom surface 70a. The second electrode 72 is adjacent to the second end surface 70c and apart from the first electrode 71 in the +Y direction.

At least a part of the first electrode 71 overlaps the first pad 61 in the Z direction. The first adhesive 65 works to bond the first pad 61 and the first electrode 71 together. In other words, the first adhesive 65 physically and electrically connects between the first pad 61 and the first electrode 71.

At least a part of the second electrode 72 overlaps the second pad 62 in the Z direction. The second adhesive 66 bonds the second pad 62 and the second electrode 72. In other words, the second adhesive 66 physically and electrically connects the second pad 62 and the second electrode 72.

The flexure 43 includes a backing layer 81, a base layer 82, a conductive layer 83, and a cover layer 84. The backing layer 81 is an example of a metal plate. The base layer 82 is an example of a second insulating layer. The cover layer 84 is an example of a first insulating layer. The backing layer 81, the base layer 82, the conductive layer 83, and the cover layer 84 are laminated in the Z direction.

The backing layer 81 is, for example, a metal plate made of metal such as stainless steel. The backing layer 81 has two surfaces 81a and 81b. The surface 81a is an example of the third surface. The surface 81a substantially flat and faces the +Z direction. The surface 81b is opposite the surface 81a. The surface 81b is substantially flat and faces the −Z direction. The surface 81b is exposed to the outside and forms the surface of the flexure 43 opposite the outer surface 43a.

The base layer 82 and the cover layer 84 are made of an insulator such as polyimide (PI). The material of the base layer 82 is the same as the material of the cover layer 84.

Note that the material of the base layer 82 and the material of the cover layer 84 may be different from each other.

The base layer 82 covers the surface 81a of the backing layer 81 and is fixed to the surface 81a. The base layer 82 may be joined to the surface 81a via, for example, an adhesive layer, or may be directly attached to the surface 81a.

The base layer 82 has two surfaces 82a and 82b. The surface 82a is substantially flat and faces the +Z direction. The surface 82b is opposite the surface 82a. The surface 82b is substantially flat and faces the −Z direction. The surface 82b is fixed to the surface 81a of the backing layer 81.

The conductive layer 83 is disposed on the surface 82a of the base layer 82. The conductive layer 83 is made of a conductor such as copper. The conductive layer 83 is thinner than the backing layer 81. Note that the thicknesses of the backing layer 81 and the conductive layer 83 are not limited to this example.

The conductive layer 83 includes, for example, a plurality of wiring patterns and pads. The conductive layer 83 has the first pad 61 and the second pad 62. Further, the conductive layer 83 includes a pad connected to the magnetic head 14, a pad connected to the FPC 18, and a wiring pattern that connects the plurality of pads to each other. Note that the conductive layer 83 is not limited to this example.

The cover layer 84 covers the surface 82a of the base layer 82 and at least a part of the conductive layer 83, and is fixed to the base layer 82 and the conductive layer 83. That is, the cover layer 84 covers at least a part of the conductive layer 83 and covers the base layer 82 at a position where the conductive layer 83 is not provided. The cover layer 84 may be joined to the surface 82a by, for example, an adhesive layer, or may be directly attached to the surface 82a.

In the flexure 43, the base layer 82 is located between the backing layer 81 and the cover layer 84. The conductive layer 83 is located between the base layer 82 and the cover layer 84. Note that the flexure 43 may be a multilayer board having a plurality of insulating layers and a plurality of conductive layers instead of the base layer 82.

The cover layer 84 has two surfaces 84a and 84b. The surface 84a is exposed to the outside and forms a part of the outer surface 43a of the flexure 43. The surface 84b is opposite the surface 84a. The surface 84b is fixed to the surface 82a of the base layer 82 and the conductive layer 83.

The cover layer 84 is provided with a first hole 85 and a second hole 86. The first hole 85 and the second hole 86 penetrate the cover layer 84 in the substantially Z direction and open to the surfaces 84a and 84b, respectively.

The first hole 85 is located in the first connection 51 to expose at least a part of the first pad 61 to the outside of the flexure 43. The surface of the first pad 61 exposed through the first hole 85 forms a part of the outer surface 43a of the flexure 43.

The first adhesive 65 bonds the first pad 61 and the first electrode 71 via the first hole 85. The first adhesive 65 covers the first pad 61 exposed through the first hole 85. That is, the first pad 61 is exposed to the outside of the flexure 43 through the first hole 85, but may be covered with an element different from the flexure 43 such as the first adhesive 65.

The second hole 86 is located in the second connection 52 to expose at least a part of the second pad 62 to the outside of the flexure 43. The surface of the second pad 62 exposed through the second hole 86 forms a part of the outer surface 43a of the flexure 43. That is, the outer surface 43a includes the surface 84a of the cover layer 84, the surface of the first pad 61 exposed through the first hole 85, and the surface of the second pad 62 exposed through the second hole 86.

The second adhesive 66 bonds the second pad 62 and the second electrode 72 via the second hole 86. The second adhesive 66 covers the second pad 62 exposed through the second hole 86. That is, the second pad 62 is exposed to the outside of the flexure 43 through the second hole 86. Alternatively, the second pad 62 may be covered with an element different from the flexure 43 such as the second adhesive 66.

In the present embodiment, the thickness of the cover layer 84 is substantially constant. Of the cover layer 84, thus, the part covering the conductive layer 83 and the part covering the base layer 82 can be different in position in the Z direction.

The surface 84*a* has a first region 84*aa*, a second region 84*ab*, and a third region 84*ac*. The first region 84*aa* is an example of the first surface. The second region 84*ab* is an example of the second surface. The first region 84*aa*, the second region 84*ab*, and the third region 84*ac* are a part of the outer surface 43*a* and are included in the outer surface 43*a*.

The first region 84*aa* is located in a part covering the first pad 61, of the cover layer 84. Therefore, the first hole 85 opens to the first region 84*aa*. The second region 84*ab* is provided in a part of the cover layer 84 that covers the second pad 62. The second hole 86 thus opens to the second region 84*ab*.

The third region 84*ac* is provided in a portion of the cover layer 84 covering the base layer 82. Therefore, the third region 84*ac* is closer to the base layer 82 than the first region 84*aa* and the second region 84*ab*. On the other hand, each of the first region 84*aa* and the second region 84*ab* is closer to the second MA 48 than the third region 84*ac*.

Note that the thickness of the cover layer 84 may not be constant. For example, in the Z direction, the position of the first region 84*aa*, the position of the second region 84*ab*, and the position of the third region 84*ac* may be substantially the same.

In the direction orthogonal to the Z direction, the backing layer 81 and the base layer 82 are approximately the same in terms of shape and size. Thus, the backing layer 81 overlaps the first connection 51 and the second connection 52 in the Z direction, thereby improving the rigidity of the first connection 51 and the second connection 52. The surface 81*a* of the backing layer 81 faces the first pad 61 and the second pad 62 via the base layer 82.

The flexure 43 is provided with two protrusions 90. The protrusions 90 may also be referred to as, for example, walls or stops. The two protrusions 90 include a first protrusion 91 and a second protrusion 92. In other words, one of the two protrusions 90 is the first protrusion 91, and the other of the two protrusions 90 is the second protrusion 92. Hereinafter, the description common to the first protrusion 91 and the second protrusion 92 will be described as the description of the protrusion 90.

The two protrusions 90 both protrude substantially in the +Z direction from the outer surface 43*a* of the flexure 43. The first protrusion 91 protrudes from the outer surface 43*a* in the first connection 51. The second protrusion 92 protrudes from the outer surface 43*a* in the second connection 52. The first protrusion 91 and the second protrusion 92 are thus juxtaposed to each other with a gap in the Y direction.

The two protrusions 90 are both located at least partially between the first adhesive 65 and the second adhesive 66. The two protrusions 90 are also located between the first pad 61 and the second pad 62 in the Y direction (+Y direction).

Each of the two protrusions 90 has an end surface 90*a*. The end surface 90*a* is located at the end of the protrusion 90 in the +Z direction and faces substantially the +Z direction. The position of the end surface 90*a* is substantially unchanged in the Z direction. In other words, the distance between the end surface 90*a* and the first region 84*aa* or the second region 84*ab* in the Z direction is substantially constant. Note that the end surface 90*a* is not limited to this example, and may have unevenness or inclination.

The first protrusion 91 is located between the first electrode 71 and the second electrode 72 in the Y direction. The end surface 90*a* of the first protrusion 91 faces the bottom surface 70*a* of the piezoelectric body 70. In the present embodiment, the end surface 90*a* of the first protrusion 91 is in contact with the bottom surface 70*a*. Note that the end surface 90*a* of the first protrusion 91 may be spaced apart from the bottom surface 70*a*.

In the Y direction, the second protrusion 92 is located between both ends of the second electrode 72. The end surface 90*a* of the second protrusion 92 thus faces the second electrode 72. In other words, the end surface 90*a* of the second protrusion 92 faces the bottom surface 70*a* on which the second electrode 72 is mounted. In the present embodiment, the end surface 90*a* of the second protrusion 92 is in contact with the second electrode 72. Note that the end surface 90*a* of the second protrusion 92 may be spaced apart from the second electrode 72.

For example, the protrusion 90 protrudes from the third region 84*ac* of the outer surface 43*a* of the flexure 43. The protrusion 90 protrudes from the third region 84*ac* beyond the first region 84*aa* and the second region 84*ab*. Because of this, the end surface 90*a* of the protrusion 90 is closer to the bottom surface 70*a* of the piezoelectric body 70 than the first region 84*aa* and the second region 84*ab* of the cover layer 84.

The end surface 90*a* is a portion of the flexure 43 closest to the second MA 48. Note that the flexure 43 may have a portion close to the second MA 48 as much as the end surface 90*a*, or may have a portion closer to the second MA 48 than the end surface 90*a*.

As illustrated in FIG. 3, the two protrusions 90 extend linearly in the substantially X direction. The two protrusions 90 thus extend substantially in parallel. Note that the protrusions 90 may extend in other directions or may extend in a curved form.

In the X direction the two protrusions 90 are longer than the second MA 48. Further, in the X direction the two protrusions 90 extend across the two side surfaces 70*d* of the piezoelectric body 70. The X direction is a direction along the outer surface 43*a* and orthogonal to the Y direction (+Y direction), and is an example of the second direction. Note that the length of the protrusion 90 in the X direction is not limited to this example.

As illustrated in FIG. 4, in the present embodiment, the protrusions 90 are provided on the base layer 82 and the cover layer 84. Note that the protrusions 90 may be provided on one of the base layer 82 and the cover layer 84.

Specifically, at the end of the first connection 51 in the +Y direction, a part of the base layer 82 and a part of the cover layer 84 are bent to protrude from the outer surface 43*a* in the +Z direction. As a result, the part of the base layer 82 and the part of the cover layer 84 form the first protrusion 91.

Further, at the end of the second connection 52 in the −Y direction, a part of the base layer 82 and a part of the cover layer 84 are bent to protrude from the outer surface 43*a* in the +Z direction. As a result, the part of the base layer 82 and the part of the cover layer 84 form the second protrusion 92.

The first adhesive 65 adheres to the first pad 61, the first electrode 71, and the first protrusion 91. Thus, the first adhesive 65 allows a part of the base layer 82 and a part of the cover layer 84 included in the first protrusion 91 to be maintained in a protruding posture from the outer surface 43*a*.

The second adhesive 66 adheres to the second pad 62, the second electrode 72, and the second protrusion 92. Thus, the second adhesive 66 allows a part of the base layer 82 and a part of the cover layer 84 included in the second protrusion 92 to be maintained in a protruding posture from the outer surface 43*a*.

Hereinafter, an example of a method of mounting the second MA 48 on the flexure 43 as a part of the method of manufacturing the suspension 37 will be described with reference to FIGS. 4 to 6. Note that the method of mounting the second MA 48 is not limited to the following method, and other methods may be used.

Figure 5:
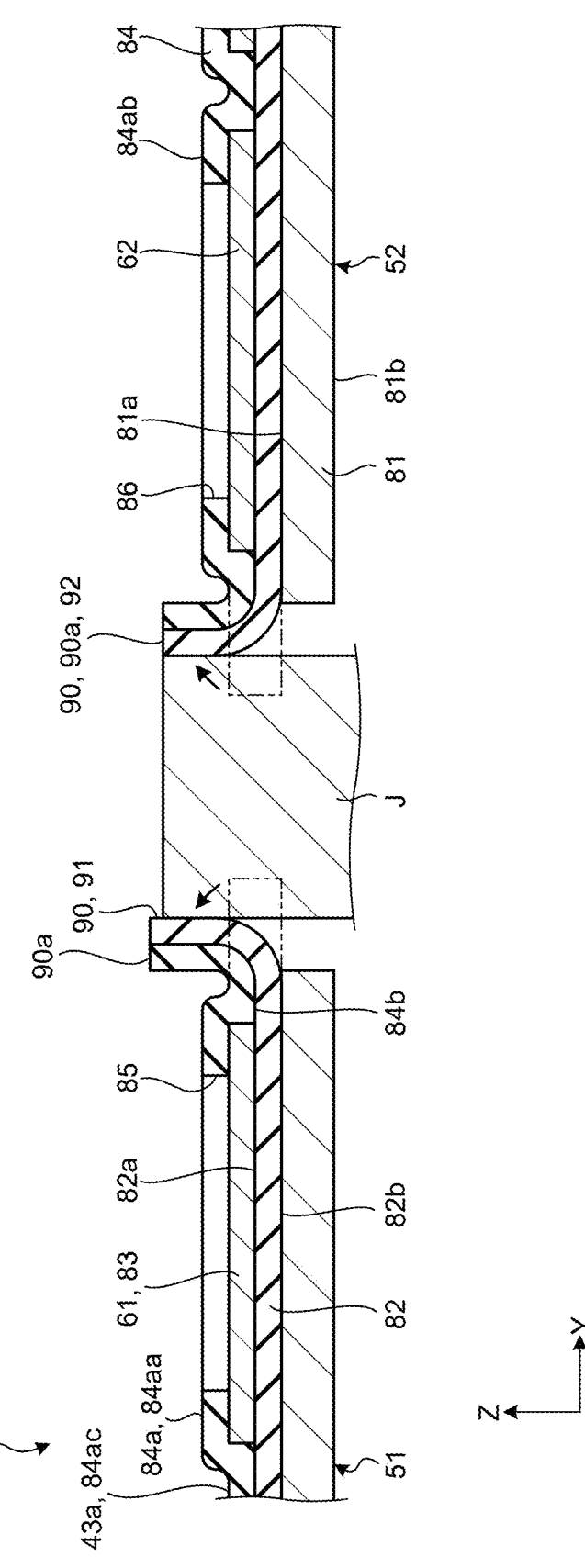
FIG. 5 is an exemplary cross-sectional view illustrating a flexure and a jig of the first embodiment.

FIG. 5 is an exemplary cross-sectional view illustrating the flexure 43 and a jig J of the first embodiment. First, a part of the flexure 43 is bent using the jig J to form the protrusion 90. That is, a part of the base layer 82 and a part of the cover layer 84 are bent at the end of the first connection 51 in the +Y direction and the end of the second connection 52 in the −Y direction. FIG. 5 virtually illustrates a part of the base layer 82 and a part of the cover layer 84 before being bent by a two-dot chain line.

A part of the base layer 82 and a part of the cover layer 84 are elastically deformed by being bent. The jig J holds the bent parts of the base layer 82 and the cover layer 84. As a result, the jig J prevents the part of the base layer 82 and the part of the cover layer 84 from being restored to the original forms.

Figure 6:
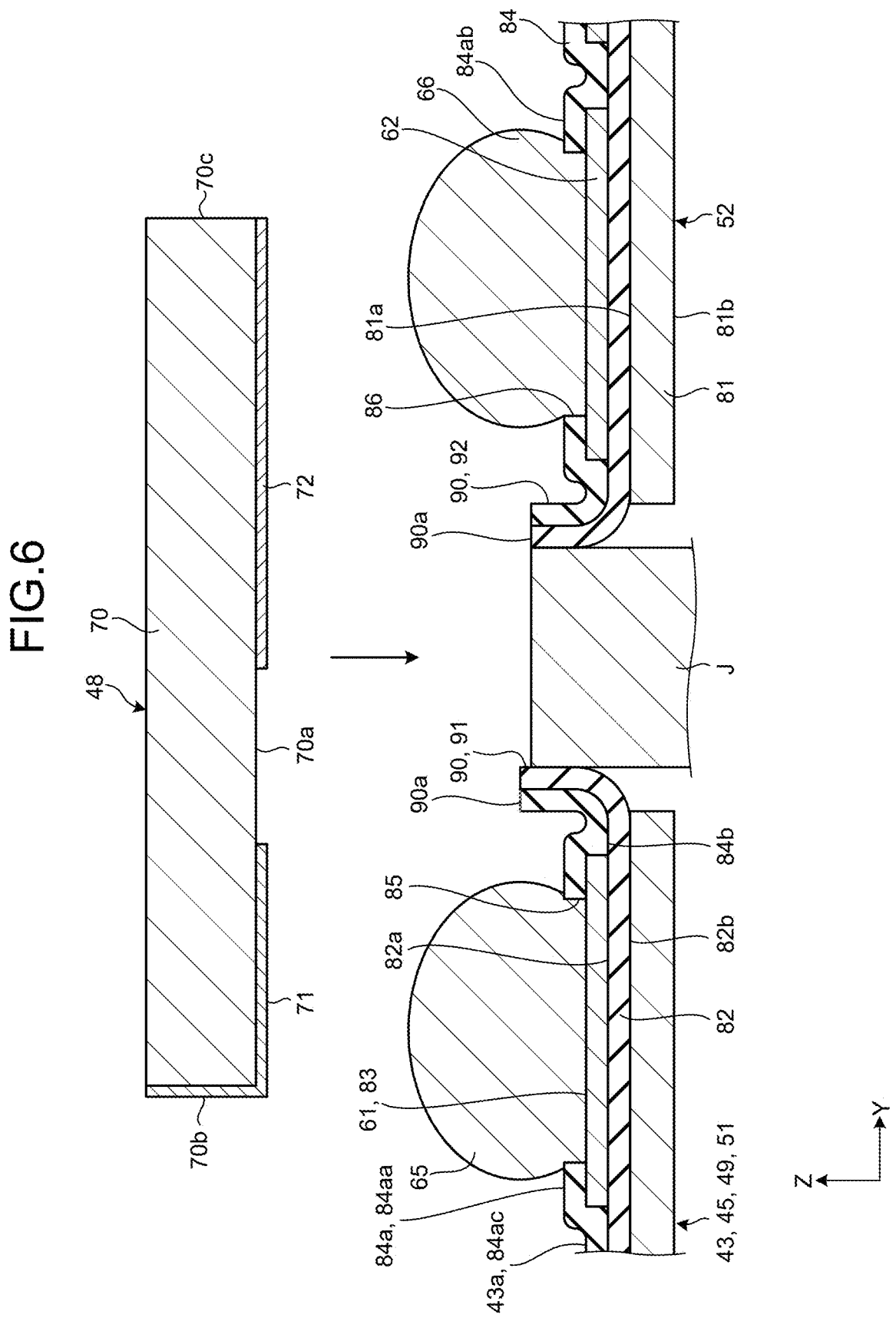
FIG. 6 is an exemplary cross-sectional view illustrating a flexure and a second MA of the first embodiment.

FIG. 6 is an exemplary cross-sectional view illustrating the flexure 43 and the second MA 48 of the first embodiment. Next, the first adhesive 65 is applied to the first pad 61, and the second adhesive 66 is applied to the second pad 62. At this point, the first adhesive 65 and the second adhesive 66 are not cured and have fluidity. Note that the first adhesive 65 may be applied to the first electrode 71. In addition, the second adhesive 66 may be applied to the second electrode 72.

Next, the second MA 48 is placed on the flexure 43 by, for example, a mounter. The mounter moves the second MA 48 close to the flexure 43 until the second MA 48 abuts on the protrusion 90. As the second MA 48 approaches the flexure 43, the first adhesive 65 and the second adhesive 66 are pressed between the outer surface 43*a* of the flexure 43 and the bottom surface 70*a* of the piezoelectric body 70.

The first adhesive 65 and second adhesive 66 are pressed and spread along the outer surface 43*a* and the bottom surface 70*a*. For example, the first adhesive 65 and the second adhesive 66 spread in the X direction and the Y direction.

The edge of the pressed first adhesive 65 approaches, for example, the second pad 62, the second adhesive 66, and the second electrode 72. However, as illustrated in FIG. 4, the first protrusion 91 blocks the first adhesive 65. In other words, the first protrusion 91 adheres to the first adhesive 65 to restrict the first adhesive 65 from further approaching the second pad 62, the second adhesive 66, and the second electrode 72.

The first protrusion 91 is located between the first electrode 71 and the second electrode 72 in the Y direction. Therefore, the first adhesive 65 attached to the first protrusion 91 is spaced apart from the second electrode 72.

Further, the first adhesive 65 is spaced apart from the second pad 62 and the second adhesive 66.

In the Y direction, the second protrusion 92 is located between both ends of the second electrode 72 in the Y direction. Therefore, the second adhesive 66 attached to the second protrusion 92 is spaced apart from the first electrode 71. Further, the second adhesive 66 is spaced apart from the first pad 61 and the first adhesive 65.

As described above, the first protrusion 91 and the second protrusion 92 restrict the first adhesive 65 and the second adhesive 66 from approaching each other. However, the first adhesive 65 and the second adhesive 66 may flow beyond the first protrusion 91 and the second protrusion 92. However, the first protrusion 91 and the second protrusion 92 can reduce the amount of the first adhesive 65 and the second adhesive 66 flowing out beyond the first protrusion 91 and the second protrusion 92.

Next, the first adhesive 65 and the second adhesive 66 are cured. As a result, the first adhesive 65 keeps the first protrusion 91 in a posture protruding from the outer surface 43*a*. Further, the second adhesive 66 keeps the second protrusion 92 in a posture protruding from the outer surface 43*a*.

Next, the jig J is removed from the flexure 43. This completes the mounting of the second MA 48 on the flexure 43. Note that the jig J may position the second MA 48 in the Z direction.

In the above example, the protrusions 90 are formed by bending the base layer 82 and the cover layer 84. Alternatively, the protrusions 90 may be formed by another method. For example, the protrusions 90 may be formed by etching at the time of manufacturing the flexure 43.

Figure 7:
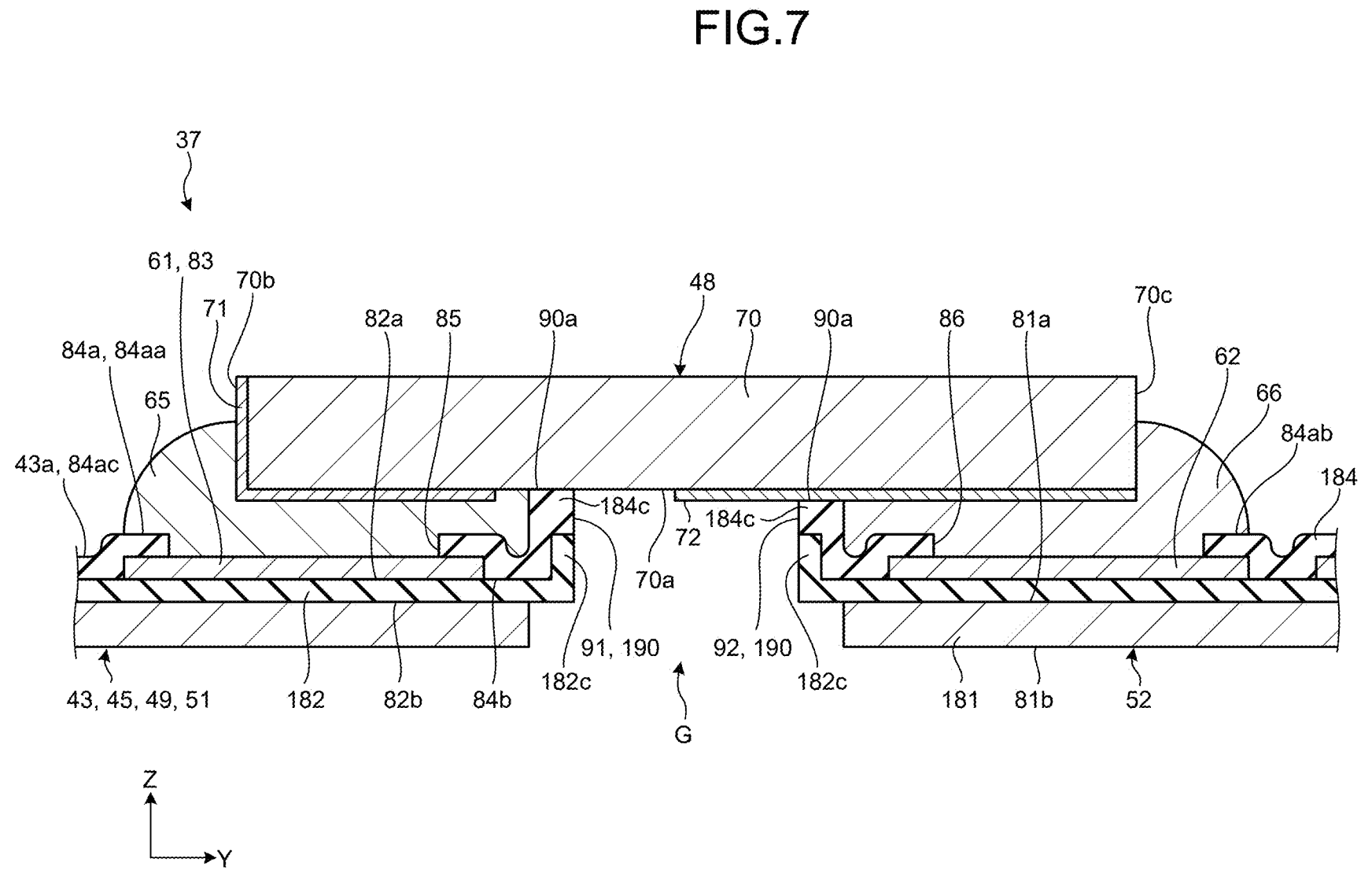

FIG. 7 is an exemplary cross-sectional view illustrating a part of the suspension 37 according to a modification of the first embodiment. As illustrated in FIG. 7, in the modification, the flexure 43 includes a base layer 182 instead of the base layer 82, and includes a cover layer 184 instead of the cover layer 84. The base layer 182 is equivalent to the base layer 82 except for the features as below. The cover layer 184 is equivalent to the cover layer 84 except for the features as below. The base layer 182 and the cover layer 184 do not include a bent part to form the protrusions 90.

For example, in forming the base layer 182, the base layer 182 is decreased in thickness by etching. This forms the surface 82*a* on the base layer 182. The rest of the base layer 182 with no decrease in thickness protrudes from the surface 82*a* to form a protruding end 182*c*.

The flexure 43 has protrusions 190 instead of the protrusions 90. The protrusions 190 are equivalent to the protrusions 90 except for the features as below. A portion of the cover layer 184 covering the protruding end 182*c* protrudes from a portion of the cover layer 184 covering the surface 82*a* in the +Z direction. As a result, a portion of the cover layer 184 covering the protruding end 182*c* has a stepwise form, forming the protrusion 190.

In addition, in forming the cover layer 184, the cover layer 184 is partially decreased in thickness by etching. This forms the surface 84*a* on the cover layer 184. The rest of the cover layer 184 with no decrease in thickness protrudes from the surface 84*a* to form a protruding end 184*c*. That is, the protruding end 184*c* protrudes from the outer surface 43*a* of the flexure 43. The protruding end 184*c* thus has a stepwise form to form the protrusion 190.

In the HDD 10 according to the first embodiment described above, the first conductive adhesive 65 bonds the first pad 61 and the first electrode 71. The second conductive adhesive 66 bonds the second pad 62 and the second electrode 72. The flexure 43 is provided with the protrusions 90. The protrusions 90 are located at least partially between the first adhesive 65 and the second adhesive 66, and protrude from the outer surface 43a. For example, in mounting the second MA 48 on the flexure 43, the first adhesive 65 and the second adhesive 66 are pressed between the second MA 48 and the flexure 43 and spread along the outer surface 43a and the bottom surface 70a. The protrusions 90 can restrict the first adhesive 65 and the second adhesive 66 from approaching each other beyond the protrusions 90 by blocking at least one of the first adhesive 65 and the second adhesive 66 spreading along the outer surface 43a and the bottom surface 70a. As a result, the HDD 10 can restrain the first adhesive 65 and the second adhesive 66 from spreading in an undesirable direction, leading to avoiding the first electrode 71 and the second electrode 72 from short-circuiting due to the first adhesive 65 and second adhesive 66. Thereby, the HDD 10 can provide stable electrical characteristics. The cover layer 84 is provided with the first hole 85 for exposing the first pad 61 and the second hole 86 for exposing the second pad 62. The cover layer 84 has the first region 84aa to which the first hole 85 is open, and the second region 84ab to which the second hole 86 is open. The first region 84aa and the second region 84ab are included in the outer surface 43a. A part of the cover layer 84 including the first region 84aa and the second region 84ab covers a part of the conductive layer 83 including the first pad 61 and the second pad 62. Because of this, the first region 84aa and the second region 84ab are closer to the bottom surface 70a than a part of the cover layer 84, the part not covering the conductive layer 83. The protrusions 90 each have an end surface 90a facing the bottom surface 70a. The end surface 90a is closer to the bottom surface 70a than the first region 84aa and the second region 84ab. That is, the protrusions 90 protrude from the outer surface 43a higher than the first region 84aa and the second region 84ab. As a result, the protrusions 90 can restrict the first adhesive 65 and the second adhesive 66 from approaching each other beyond the protrusions 90 by blocking at least one of the first adhesive 65 and the second adhesive 66 spreading along the outer surface 43a and the bottom surface 70a.

The protrusions 90 include the first protrusion 91. The first protrusion 91 is located between the first electrode 71 and the second electrode 72 in the +Y direction and protrudes from the outer surface 43a. As a result, the first protrusion 91 can restrict the first adhesive 65 adhering to the first electrode 71 and the second adhesive 66 adhering to the second electrode 72 from approaching each other beyond the first protrusions 91.

The protrusions 90 include the second protrusion 92. The second protrusion 92 is located between the first pad 61 and the second pad 62 in the +Y direction, and protrudes from the outer surface 43a. As a result, the second protrusion 92 can restrict the first adhesive 65 adhering to the first pad 61 and the second adhesive 66 adhering to the second pad 62 from approaching each other beyond the second protrusion 92.

The end surfaces 90a are closest to the second MA 48 in the flexure 43. As a result, the protrusions 90 can restrict the first adhesive 65 and the second adhesive 66 from approaching each other beyond the protrusions 90 by blocking at least one of the first adhesive 65 and the second adhesive 66 spreading along the flexure 43.

The protrusions 90 are provided on at least one of the cover layer 84 and the base layer 82. This eliminates the necessity for the HDD 10 to add members and components to form the protrusions 90, avoiding an increase in cost.

In the Z direction orthogonal to the outer surface 43a, a distance between the first region 84aa and the end surface 90a is constant. In other words, the protrusion 90 has a constant height. As a result, the protrusion 90 can restrict the first adhesive 65 and the second adhesive 66 from approaching each other beyond the protrusion 90.

In the X direction along the outer surface 43a and orthogonal to the +Y direction, the protrusion 90 is longer than the second MA 48 and extends across both side surfaces 70d of the second MA 48. The protrusion 90 can restrict the first adhesive 65 and the second adhesive 66 from approaching each other beyond the protrusion 90 by blocking at least one of the first adhesive 65 and the second adhesive 66 spreading along the bottom surface 70a.

The protrusion 90 is formed of, for example, a part of the elastically deformed flexure 43. At least one of the first adhesive 65 and the second adhesive 66 adheres to the protrusion 90. Thereby, at least one of the first adhesive 65 and the second adhesive 66 allows the protrusion 90 to be maintained in shape.

The flexure 43 includes the first connection 51 and the second connection 52. The first connection 51 is provided with the first pad 61. The second connection 52 is spaced apart from the first connection 51 in the +Y direction, and is provided with the second pad 62. The first connection 51 and the second connection 52 are separated from each other with a gap G. The second MA 48 is located to cover the gap G in the Z direction orthogonal to the outer surface 43a. Thereby, of the flexure 43, the part including the first connection 51 can swing with respect to the part including the second connection 52 along with an expansion or contraction of the second MA 48 in the −Y direction.

Second Embodiment

Hereinafter, a second embodiment will be described with reference to FIG. 8. Note that, in the following description of the plurality of embodiments, components having functions similar to those of the components already described are denoted by the same reference numerals as those of the components already described, and the description may be omitted. In addition, the plurality of components denoted by the same reference numerals do not necessarily have all the functions and properties in common, and may have different functions and properties according to each embodiment.

Figure 8:
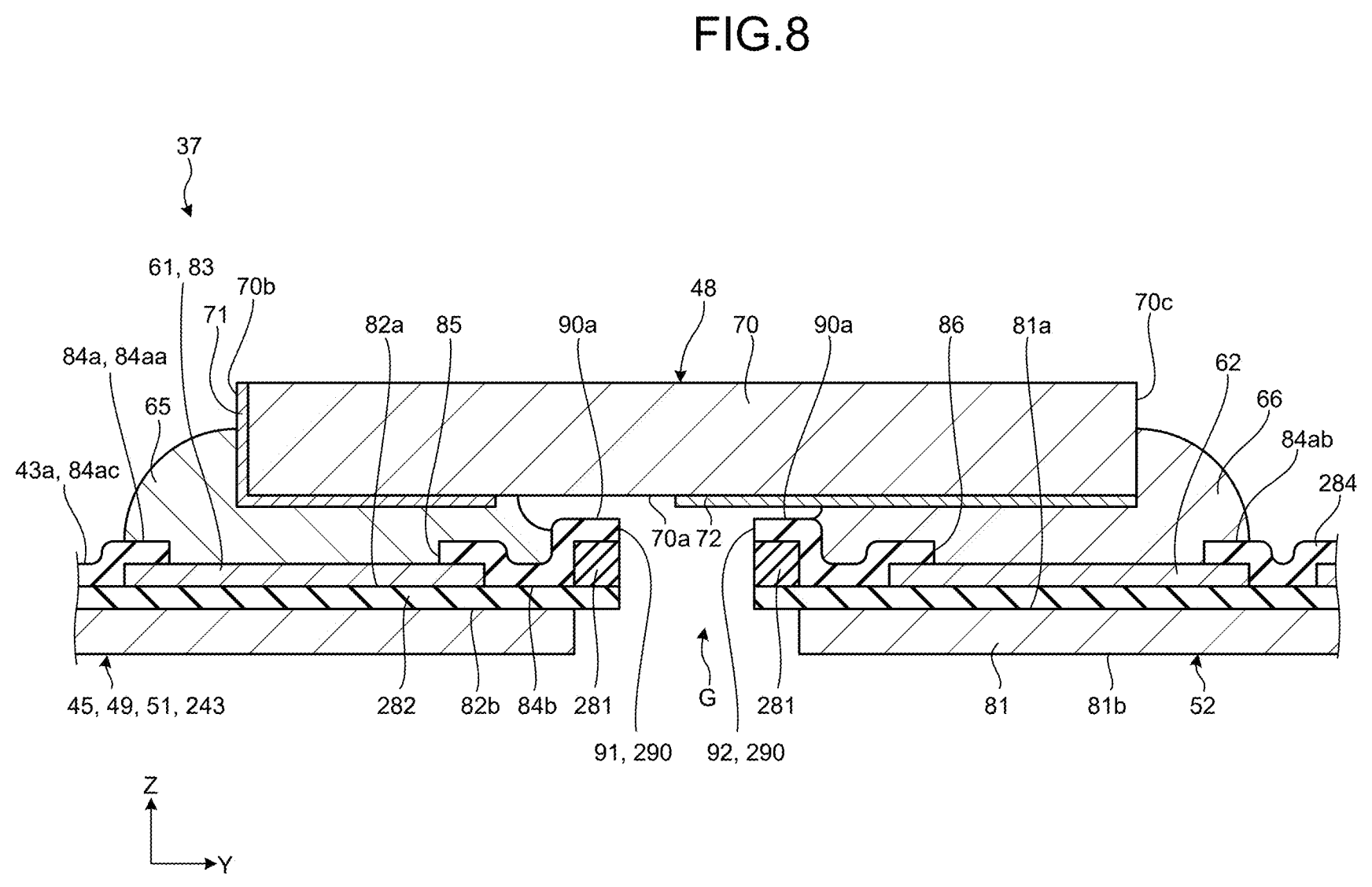

FIG. 8 is an exemplary cross-sectional view illustrating a part of the suspension 37 according to a second embodiment. In the second embodiment, the suspension 37 includes a flexure 243 instead of the flexure 43. The flexure 243 is equivalent to the flexure 43 except for the features as below.

The flexure 243 includes a base layer 282 instead of the base layer 82, and includes a cover layer 284 instead of the cover layer 84. The base layer 282 is equivalent to the base layer 82 except for the features as below. The cover layer 284 is equivalent to the cover layer 84 except for the features as below. The base layer 282 and the cover layer 284 do not include a bent part to form the protrusions 90.

The flexure 243 further includes an interlayer 281 in addition to the backing layer 81, the base layer 282, the conductive layer 83, and the cover layer 284. The interlayer 281 is, for example, an insulating layer made of an insulator such as PI. Note that the interlayer 281 may be made of a conductor.

The interlayer 281 is located between the backing layer 81 and the cover layer 284 in the Z direction. In the present embodiment, the interlayer 281 is located between the base layer 282 and the cover layer 284. Note that the interlayer 281 is not limited to this example, and may be located between the backing layer 81 and the base layer 282, for example. The thickness of the interlayer 281 is larger than the thickness of the conductive layer 83.

The interlayer 281 is located at least partially between the first adhesive 65 and the second adhesive 66 in the Y direction (+Y direction). For example, a part of the interlayer 281 is located at the end of the first connection 51 in the +Y direction. In addition, the other part of the interlayer 281 is located at the end of the second connection 52 in the −Y direction.

The flexure 243 has two protrusions 290 instead of the two protrusions 90. The protrusions 290 are equivalent to the protrusions 90 except for the features as below. A part, of the cover layer 284, covering the interlayer 281 protrudes in a stepwise form from the rest. As a result, the part covering the interlayer 281 protrudes from the outer surface 43a of the flexure 243 to form the protrusions 290. In other words, the protrusions 290 include the overlapping part of the cover layer 284 with the interlayer 281 in the Z direction.

In the HDD 10 of the second embodiment described above, the flexure 243 further includes the interlayer 281. The interlayer 281 is located between the backing layer 81 and the cover layer 284 in the Z direction orthogonal to the outer surface 43a, and between the first adhesive 65 and the second adhesive 66 in the +Y direction. The protrusions 290 include a part of the cover layer 284, the part overlapping the interlayer 281 in the Z direction. That is, the overlapping part of the cover layer 284 with the interlayer 281 protrudes from the rest by the thickness of the interlayer 281 to form the protrusions 290. Thereby, forming the protrusions 290 in the HDD 10 can be facilitated.

For example, in the case of the interlayer 281 being a conductor, the interlayer 281 may cause short circuit or noise. However, the interlayer 281 of the present embodiment is an insulating layer. As a result, the HDD 10 can restrain the interlayer 281 from electrically affecting the flexure 243 as compared with the interlayer 281 being a conductor.

Third Embodiment

Figure 9:
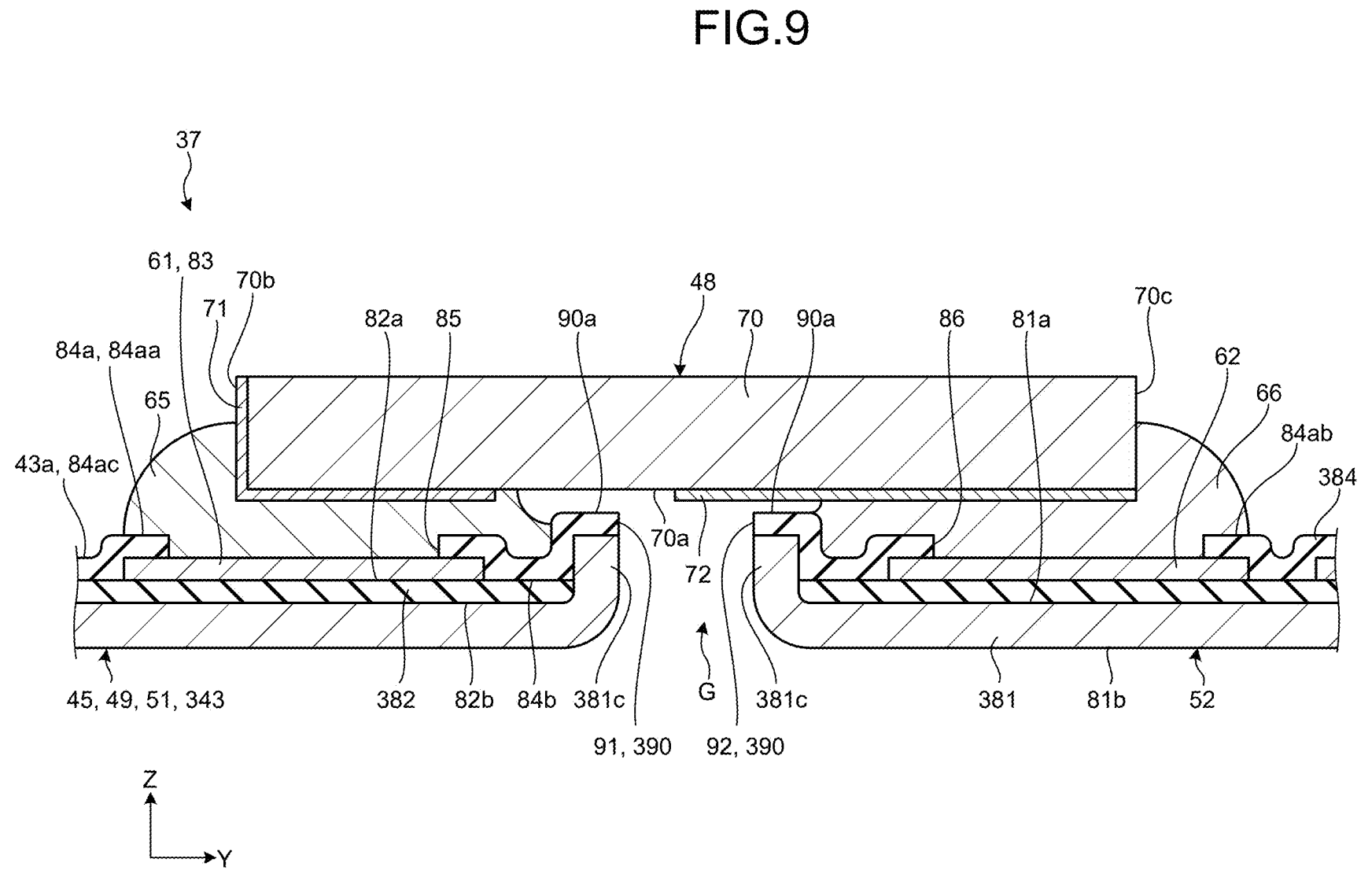

Hereinafter, a third embodiment will be described with reference to FIG. 9. FIG. 9 is an exemplary cross-sectional view illustrating a part of the suspension 37 according to a third embodiment. In the third embodiment, the flexure 43 has a backing layer 381 instead of the backing layer 81, a base layer 382 instead of the base layer 82, and a cover layer 384 instead of the cover layer 84. The backing layer 381 is equivalent to the backing layer 81 except for the features as below.

The base layer 382 is equivalent to the base layer 82 except for the features as below. The cover layer 384 is equivalent to the cover layer 84 except for the features as below. The base layer 382 and the cover layer 384 do not include a bent part to form the protrusions 90.

The backing layer 381 further includes two inner protrusions 381c. The two inner protrusions 381c are both located at least partially between the first adhesive 65 and the second adhesive 66 in the Y direction (+Y direction), and protrude from the surface 81a of the backing layer 381 toward the second MA 48.

The inner protrusions 381c are formed of, for example, a part of the bent backing layer 381. Note that the inner protrusion 381c is not limited to this example, and may be formed by, for example, etching, press molding, cutting, or another method.

The flexure 43 has two protrusions 390 instead of the two protrusions 90. The protrusions 390 are equivalent to the protrusions 90 except for the features as below. A part, of the cover layer 384, covering the inner protrusions 381c protrudes in a stepwise form from the rest. As a result, the part covering the inner protrusions 381c protrudes from the outer surface 43a of the flexure 43 to form the protrusions 390. In other words, the protrusions 390 include a part of the cover layer 384, the part overlapping the inner protrusions 381c in the Z direction.

In the HDD 10 of the third embodiment described above, the backing layer 381 has the front surface 81a and the inner protrusions 381c. The surface 81a faces the first pad 61 and the second pad 62 via the base layer 382. The inner protrusions 381c are located at least partially between the first adhesive 65 and the second adhesive 66 in the +Y direction, and protrude from the surface 81a toward the second MA 48. The protrusions 390 include a part of the cover layer 384, the part overlapping the inner protrusions 381c in the Z direction. That is, the overlapping part of the cover layer 384 with the inner protrusions 381c protrudes from the rest by the height of the inner protrusions 381c to form the protrusions 390. This can facilitate the formation of the protrusions 390 in the HDD 10. This further eliminates the necessity for the HDD 10 to add members and components to form the protrusions 390, thereby avoiding an increase in cost.

Fourth Embodiment

Figure 10:
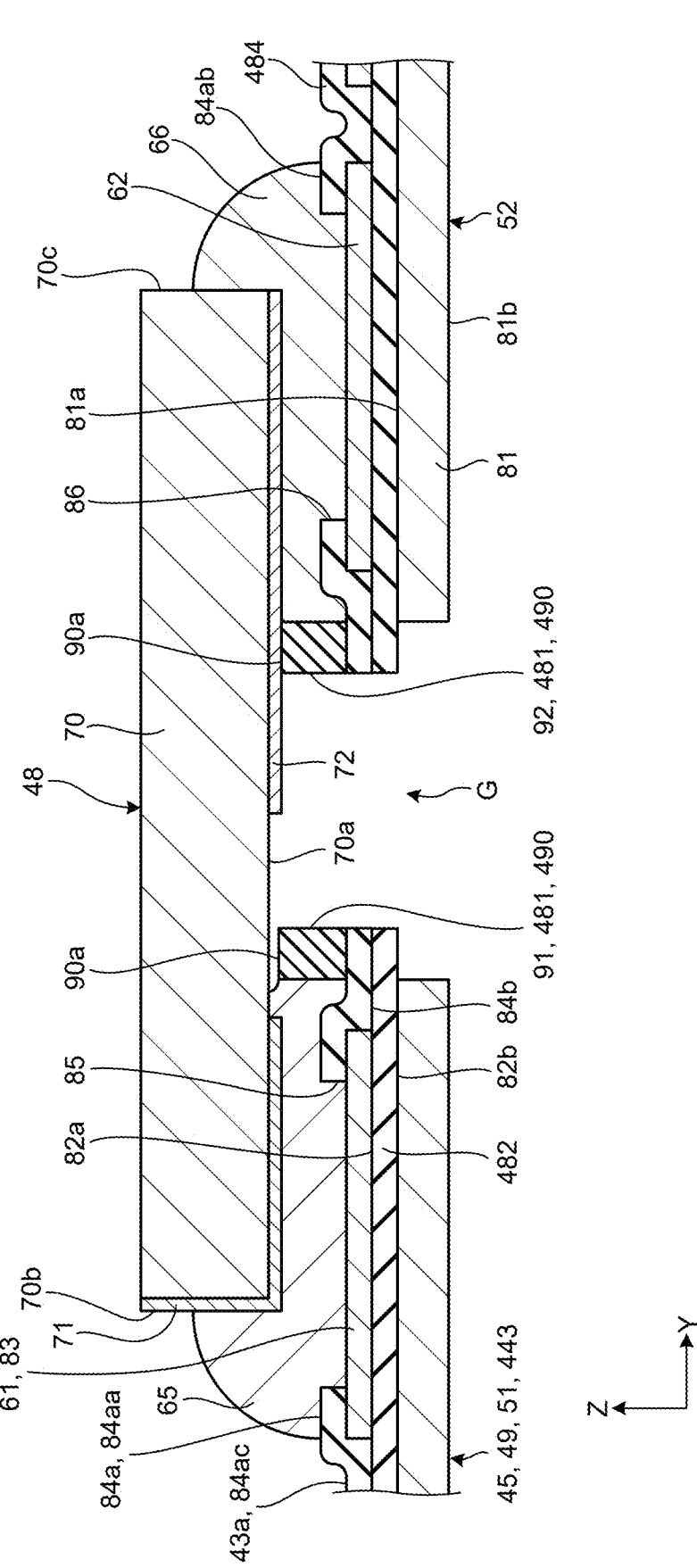
FIG. 10 is an exemplary cross-sectional view illustrating a part of a suspension according to a fourth embodiment.

Hereinafter, a fourth embodiment will be described with reference to FIG. 10. FIG. 10 is an exemplary cross-sectional view illustrating a part of the suspension 37 according to a fourth embodiment. In the fourth embodiment, the suspension 37 includes a flexure 443 instead of the flexure 43. The flexure 443 is equivalent to the flexure 43 except for the features as below.

The flexure 443 includes a base layer 482 instead of the base layer 82, and includes a cover layer 484 instead of the cover layer 84. The base layer 482 is equivalent to the base layer 82 except for the features as below. The cover layer 484 is equivalent to the cover layer 84 except for the features as below. The base layer 482 and the cover layer 484 do not include a bent part to form the protrusions 90.

The flexure 443 further includes a protruding layer 481 in addition to the backing layer 81, the base layer 482, the conductive layer 83, and the cover layer 484. The protruding layer 481 is an example of a third insulating layer. The protruding layer 481 is, for example, an insulating layer made of an insulator such as PI. The protruding layer 481 is provided on the surface 84a of the cover layer 484. In other words, the protruding layer 481 covers the outer surface 43a.

The protruding layer 481 is located at least partially between the first adhesive 65 and the second adhesive 66 in the Y direction (+Y direction). For example, a part of the protruding layer 481 is located at the end of the first connection 51 in the +Y direction. In addition, the other part of the protruding layer 481 is located at the end of the second connection 52 in the −Y direction.

The flexure 443 has two protrusions 490 instead of the two protrusions 90. The protrusions 490 are equivalent to the protrusions 90 except for the features as below. The protruding layer 481 protrudes from the outer surface 43a to form the protrusions 490. In other words, the protrusions 490 include the protruding layer 481.

In the HDD 10 according to the fourth embodiment described above, the protrusions 490 include the protruding layer 481 covering the outer surface 43a. That is, the protrusions 490 are formed by laminating the protruding layer 481 on the outer surface 43a. Thereby, the protrusions 490 can be easily formed in the HDD 10. Further, the HDD 10 allows easy adjustment of the height of the protrusions 490.

The protruding layer 481 may be made of an insulating adhesive. For example, at the time of mounting the second MA 48 on the flexure 43, the conductive first adhesive 65 and second adhesive 66 are applied to the first pad 61 and the second pad 62, and the protruding layer 481 serving as an insulating adhesive is applied to the outer surface 43a.

The protruding layer 481 can block the first adhesive 65 and the second adhesive 66 spreading along the outer surface 43a and the bottom surface 70a while being pressed between the flexure 443 and the second MA 48. The protruding layer 481 is attached to the second MA 48 to be able to fix the second MA 48 to the flexure 443.

Figure 11:
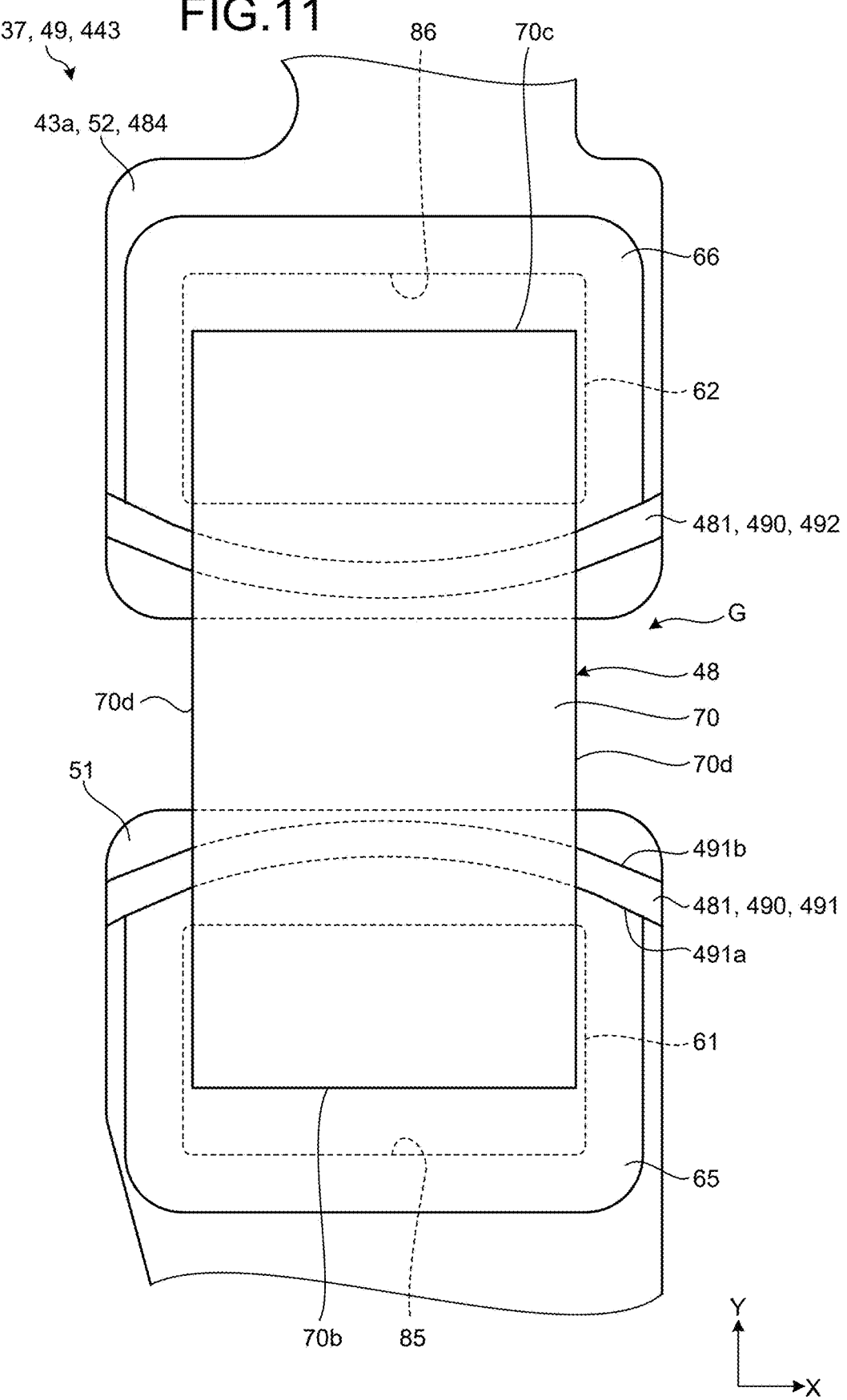
FIG. 11 is an exemplary plan view illustrating a part of a suspension according to a modification of the fourth embodiment.

FIG. 11 is an exemplary plan view illustrating a part of the suspension 37 according to a modification of the fourth embodiment. In the modification of FIG. 11, the two protrusions 490 include a first protrusion 491 and a second protrusion 492 instead of the first protrusion 91 and the second protrusion 92. The first protrusion 491 is equivalent to the first protrusion 91 except for the features as below. The second protrusion 492 is equivalent to the second protrusion 92 except for the features as below.

The first protrusion 491 is closer to the first pad 61 than to the second pad 62. In other words, the distance between the first protrusion 491 and the first pad 61 is shorter than the distance between the first protrusion 491 and the second pad 62.

The first protrusion 491 is bent in such a manner to be recessed toward the second pad 62. In other words, the first protrusion 491 extends in a curved form to surround the first pad 61. The first protrusion 491 has two side surfaces 491a and 491b.

In the direction intersecting the Z axis, the side surface 491a faces the first pad 61. The side surface 491a is a curved surface which is recessed toward the second pad 62. The side surface 491b is opposite the side surface 491a. The side surface 491b is a curved surface projecting toward the second pad 62. Note that the side surface 491b may extend linearly.

The first protrusion 491 and the second protrusion 492 are substantially mirror-symmetrical to each other across the gap G. That is, the second protrusion 492 is closer to the second pad 62 than to the first pad 61. The second protrusion 492 is bent in such a manner as to be recessed toward the first pad 61.

According to the HDD 10 of the modification of FIG. 11 described above, the first protrusion 491 is closer to the first pad 61 than to the second pad 62. The first protrusion 491 is bent in such a manner as to be recessed toward the second pad 62. In other words, the first protrusion 491 extends to approximately surround the first pad 61. As a result, the first protrusion 491 can effectively block the first adhesive 65 spreading along the outer surface 43a and the bottom surface 70a.

Figure 12:
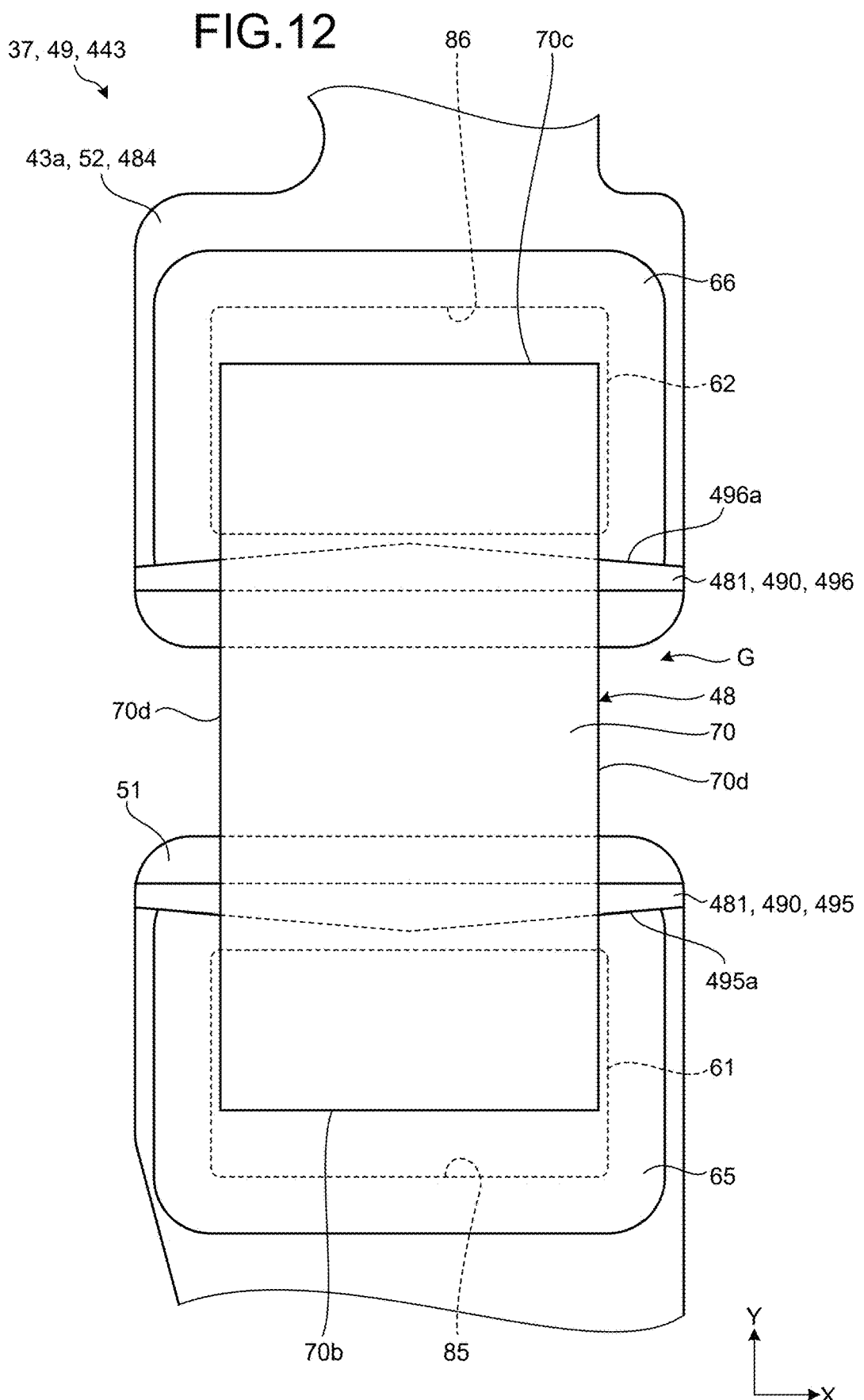
FIG. 12 is an exemplary plan view illustrating a part of a suspension according to another modification of the fourth embodiment.

FIG. 12 is an exemplary plan view illustrating a part of the suspension 37 according to another modification of the fourth embodiment. In the modification of FIG. 12, the protrusion 490 includes a first protrusion 495 and a second protrusion 496 instead of the first protrusion 91 and the second protrusion 92. The first protrusion 495 is equivalent to the first protrusion 91 except for the features as below. The second protrusion 496 is equivalent to the second protrusion 92 except for the features as below.

The first protrusion 495 is closer to the first pad 61 than to the second pad 62. The first protrusion 495 has a side surface 495a. In the direction intersecting the Z axis, the side surface 495a faces the first pad 61. The side surface 495a is tapered toward the first pad 61.

The first protrusion 495 and the second protrusion 496 are substantially mirror-symmetrical to each other across the gap G. That is, the second protrusion 496 is closer to the second pad 62 than to the first pad 61. The second protrusion 496 has a side surface 496a that tapers toward the second pad 62.

According to the HDD 10 of the modification of FIG. 12, the first protrusion 495 is tapered toward the first pad 61. As a result, the first protrusion 495 can restrict the first adhesive 65 from spreading along the outer surface 43a and the bottom surface 70a toward the second pad 62.

In the above description, the words "prevent" and "restrain" is defined as, for example, preventing occurrence of an event, an action, or an influence, or reducing the degree of an event, an action, or an influence if it occurs. In addition, in the above description, the word "restrict" is defined as, for example, preventing movement or rotation, or allowing movement or rotation within a predetermined range and preventing movement or rotation beyond the predetermined range.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device comprising:
   a magnetic disk;
   a magnetic head configured to read and write information from and to the magnetic disk;
   a flexure on which the magnetic head is mounted, the flexure including
   a first outer surface,
   a first pad on the first outer surface, and
   a second pad on the first outer surface apart from the first pad in a first direction along the first outer surface;
   a piezoelectric element including
   a second outer surface facing the first outer surface,
   a first electrode on the second outer surface, and
   a second electrode on the second outer surface apart from the first electrode in the first direction;
   a conductive, first bonding material that bonds the first pad and the first electrode;
   a conductive, second bonding material that bonds the second pad and the second electrode; and
   a protrusion provided on the flexure, located at least partially between the first bonding material and the second bonding material, and protruding from the first outer surface, wherein
   the flexure includes
   a metal plate,
   a first insulating layer,
   a second insulating layer located between the metal plate and the first insulating layer, and a conductive layer located between the first insulating layer and the second insulating layer, the conductive layer includes the first pad and the second pad, the first insulating layer with a first hole and a second hole has a first surface to which the first hole is open to expose the first pad, the first surface being included in the first outer surface, and a second surface to which the second hole is open to expose the second pad, the second surface being included in the first outer surface, the protrusion has an end surface that faces the second outer surface and is closer to the second outer surface than the first surface and the second surface, the metal plate includes a third surface facing the first pad and the second pad through the second insulating layer, and an inner protrusion located at least partially between the first bonding material and the second bonding material in the first direction and protruding from the third surface toward the piezoelectric element, and the protrusion includes a part of the first insulating layer, the part overlapping the inner protrusion in a direction orthogonal to the first outer surface.

2. The disk device according to claim 1, wherein the protrusion includes a first protrusion located between the first electrode and the second electrode in the first direction and protruding from the first outer surface.

3. The disk device according to claim 1, wherein the protrusion includes a second protrusion located between the first pad and the second pad in the first direction and protruding from the first outer surface.

4. The disk device according to claim 1, wherein of the flexure, the end surface is closest to the piezoelectric element.

5. The disk device according to claim 1, wherein in a direction orthogonal to the first outer surface, a distance between the first surface and the end surface is constant.

6. The disk device according to claim 1, wherein the protrusion is longer than the piezoelectric element and extends across both ends of the piezoelectric element in a second direction along the first outer surface and orthogonal to the first direction.

7. The disk device according to claim 1, wherein the first bonding material and the second bonding material are conductive adhesives, and at least one of the first bonding material and the second bonding material is attached to the protrusion.

8. The disk device according to claim 1, wherein the flexure includes a first connection on which the first pad is placed, and a second connection on which the second pad is placed, the second connection being spaced apart from the first connection in the first direction, the first connection and the second connection are separated from each other with a gap, and the piezoelectric element is located to cover the gap in a direction orthogonal to the first outer surface.

\*  \*  \*  \*  \*